(12) United States Patent
Subramanian

(10) Patent No.: US 6,756,796 B2
(45) Date of Patent: Jun. 29, 2004

(54) METHOD OF SEARCH AND IDENTIFY REFERENCE DIE

(75) Inventor: Balamurugan Subramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/216,454

(22) Filed: Aug. 9, 2002

(65) Prior Publication Data

US 2004/0029306 A1 Feb. 12, 2004

(51) Int. Cl.[7] .............................................. G01R 31/302
(52) U.S. Cl. ...................................... 324/750; 438/460
(58) Field of Search ........................... 700/14; 324/750; 438/460, 15

(56) References Cited

U.S. PATENT DOCUMENTS

| | | | |
|---|---|---|---|
| 6,174,788 B1 * | 1/2001 | Balamurugan | 438/460 |
| 6,216,055 B1 * | 4/2001 | Balamurugan et al. | 700/121 |
| 6,492,187 B1 * | 12/2002 | Farnworth et al. | 438/15 |
| 6,509,750 B1 * | 1/2003 | Talbot et al. | 324/750 |

* cited by examiner

Primary Examiner—John F. Niebling
Assistant Examiner—Andre' C. Stevenson
(74) Attorney, Agent, or Firm—W. James Brady, III; Frederick J. Telecky, Jr.

(57) ABSTRACT

An improved method for pick and place equipment operation is provided by an improved method for identifying the reference die on a wafer. A recording of good die, partial die, mirror die, and partial mirror die information about the neighboring dies about the reference die is formed by recording step is performed by starting at the reference die and moving clockwise about the reference die one die at a time to form a stored neighborhood matrix. Searching and identifying the reference die on a wafer includes aligning the wafer table with a wafer thereon at the reference die location coordinates determined by the recording step and starting at this location moving the wafer table one die at a time about the aligned reference die recording the neighboring die or partial die as full good die, partial die, mirror die, or partial mirror die and comparing to the information about dies or partial dies neighboring said reference die to identify the reference die.

11 Claims, 12 Drawing Sheets

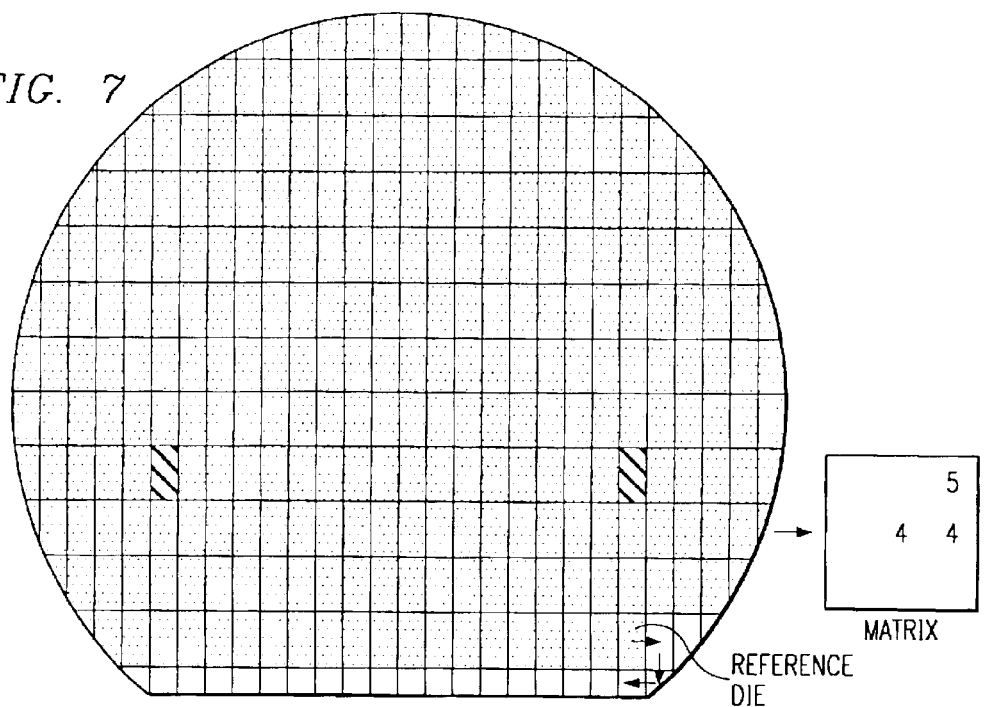
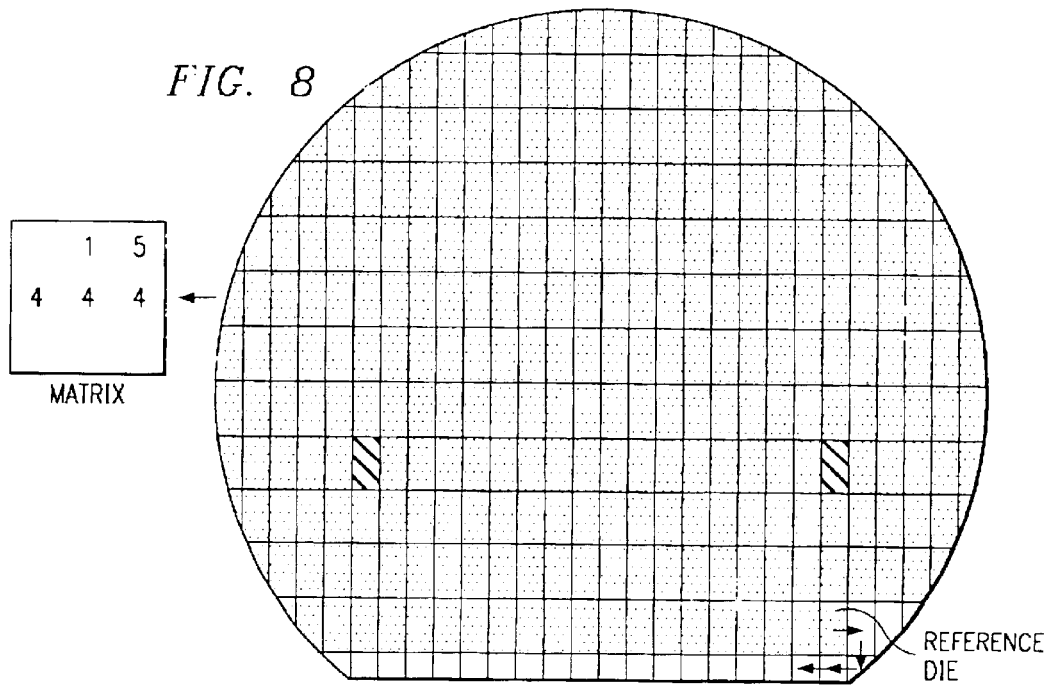

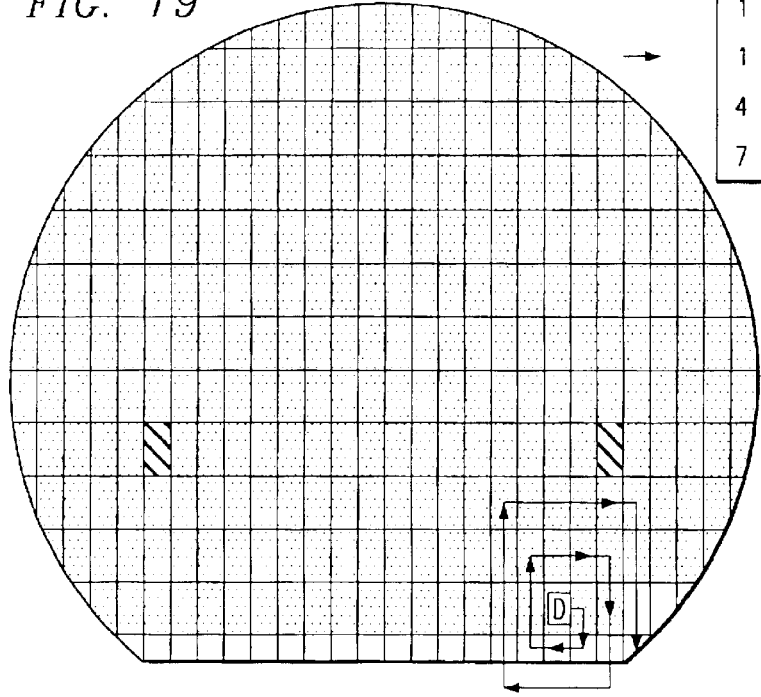

|    |    |
|----|----|
| 1R | 5  |
| 4  | 4  |

FIG. 23a

| 1 | 1  | 1 | 1 |
|---|----|---|---|
| 1 | 1D | 1 | 1 |
| 1 | 1  | 5 | 4 |
|   | 4* | 4 | 7 |

FIG. 23b

| 1 | 1  | 1 | 1 |
|---|----|---|---|
| 1 | 1D | 1 | 1 |
| 1 | 1  | 5 | 4 |
|   | 4* | 4 | 7 |

FIG. 23c

| 1 | 1  | 1 | 1 |
|---|----|---|---|
| 1 | 1D | 1 | 1 |
| 1 | 1  | 5 | 4 |
|   | 4* | 4 | 7 |

FIG. 23d

METHOD OF SEARCH AND IDENTIFY REFERENCE DIE

FIELD OF INVENTION

This invention relates a method of search and identifying a reference die on a semiconductor wafer for pick and place equipment such as a die bonder, tape and reel or die sorter.

BACKGROUND OF INVENTION

The assembly manufacturing sites receive wafers from the Wafer Fabs, segregate the individual chips from each wafer, encapsulate the chips, and perform final tests before shipping the devices to the customers. The die bonding process where only good chips from a wafer are picked up is conventionally done by an ink dot mechanism. The pick and place equipment steps through each die on a wafer to detect and skip the ink-reject chips and only mount onto the leadframe the un-inked, good chips. With the improvements in process, equipment, and systems, we now have the opportunity to totally eliminate the ink-based process with the use of wafer maps.

In an Assembly/Test (A/T) facility, wafer maps are normally received from offsite locations such as Wafer Fab or Probe sites. A wafer map originates from the Wafer Fab on a Tester or Wafer mapper equipment at the probe process. A wafer map is a set of information that is used by process equipment when handling a wafer at its workstation. The map data includes the coordinates of each die on a wafer, bin assignments for good dies and reject dies, wafer orientation or rotation, and the wafer identification that is used to associate the wafer map with the physical wafer.

The wafer map host system receives the map data, provides storage, and enables data download into the production equipment to support inkless processing of wafers to manufacture a semiconductor product. The wafer map host system transforms the lot's wafer map ASCII file into a suitable map file for the pick and place equipment to handle and prepares them for equipment download. In the manufacturing floor, as the wafer goes through the assembly process, a barcode is generated for the wafer identification (ID) or the flexframe ID and is attached to the wafer. When the wafer is ready to be processed at the pick and place equipment, the flexframe or wafer ID barcode is scanned and is used to request the wafer map from the wafer map host system. The pick and place equipment uses the downloaded wafer map to directly step into the good chips for pick-up.

In the manufacture of semiconductor devices, wafers are formed with an incomplete circular edge terminating in a flat edge. The wafers are patterned into multiple dies separated by streets or saw cut lines to separate the dies. Some of these dies are good dies, some are full pattern dies and some are not, some are mirror dies, there may be plug dies or an ink die.

FIG. 1 illustrates these dies and the wafer edge. One of the dies is a reference die. The reference die is an important die to a pick and place equipment such as a die bonder to start a pickup operation. In some cases it is the first lower right regular die on the first regular die row. The die to the right of the reference die on the first regular die row is a mirror die. In another embodiment the reference die is to the left of a group of mirror dies at the lower right of the wafer but may not be located on the first row of full dies. In other words the region or neighborhood around the reference die may not always be the same. The location of this die is important because once locating this die a wafer map can be used to aid the pick and place equipment to find the dies without the use of the ink system. The reference die is located at a predetermined column and row coordinate.

After the wafer is placed on the pick and place equipment, this equipment looks for the reference die. In the existing equipment in one wafer system, the reference die is found as illustrated in FIG. 2 by moving the wafer table down from the center of the wafer toward the flat until the monitor shows the mirror die along wafer flat row. It then moves up the column one die away from the mirror die and then moves to the right one regular die at a time till the mirror die is located. The system moves back one die to the left to find the reference die. This works well if the placement of the wafer on the pick and place equipment is perfectly aligned and if the reference die is in the first row. If however the wafer placement on the pick and place equipment is rotated, the wafer edges, partial pattern dies, plug dies and mirror dies are rotated and the alignment may not be sufficient to identify the reference die. This becomes increasingly more difficult as the size of the dies becomes smaller.

It is therefore desirable to provide an improved method of finding and identifying the reference die.

SUMMARY OF INVENTION

In accordance with one embodiment of the present invention the neighboring dies are used as to search and identify the reference die.

In accordance with another embodiment of the present invention the wafer table is rotated one die at a time one die at a time and a neighborhood matrix of information is stored and the matrix is used in the searching for the reference die.

DESCRIPTION OF DRAWINGS

FIG. 7 illustrates the reference die and the third step in the wafer table movement for neighborhood learning.

FIG. 8 illustrates the reference die and the fourth step in the wafer table movement for neighborhood learning.

FIG. 19 illustrates the reference die search and the search neighborhood matrix match Taught Neighborhood matrix after 33 dies.

FIG. 20a illustrates the taught neighborhood matrix, FIG. 20b illustrates the search neighborhood matrix, FIG. 20c illustrates taught neighborhood matrix match in the search neighborhood matrix and FIG. 20d illustrates the location of the reference die and the table movement for the 15 dies in FIG. 19.

FIG. 23a illustrates the taught neighborhood matrix, FIG. 23b illustrates the search neighborhood matrix, FIG. 23c illustrates taught neighborhood matrix match in the search neighborhood matrix and FIG. 23d illustrates the location of the reference die and the table movement for the 16 dies in FIG. 22.

DESCRIPTION OF PREFERRED EMBODIMENTS OF PRESENT INVENTION

In accordance with an embodiment of the present invention there are two major steps. Step I is neighborhood learning and Step II is searching for the reference die. There are two variables. The first variable is the number of dies to learn (N_DIES_LEARN). The second variable is the total number of dies to search (T-DIES-SEARCH). N_DIES_LEARN and T-DIES-SEARCH are required and needed to select correct number before the start of Reference die search. The selection is done one time only.

N_DIES_LEARN: At the time of neighborhood learning this variable is used. The use of the count is to learn the reference die neighborhood up to this number of dies.

T-DIES-SEARCH: At the time of Reference die search this variable is used as limit for the search. The purpose of this count is to inform the system as to the limit for Reference die search.

Figure 3:
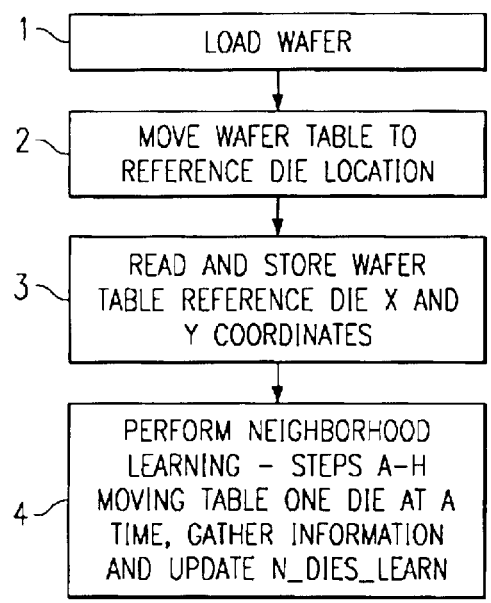
FIG. 3 is a flow chart of neighborhood learning according to one embodiment of the present invention.
Figure 4:
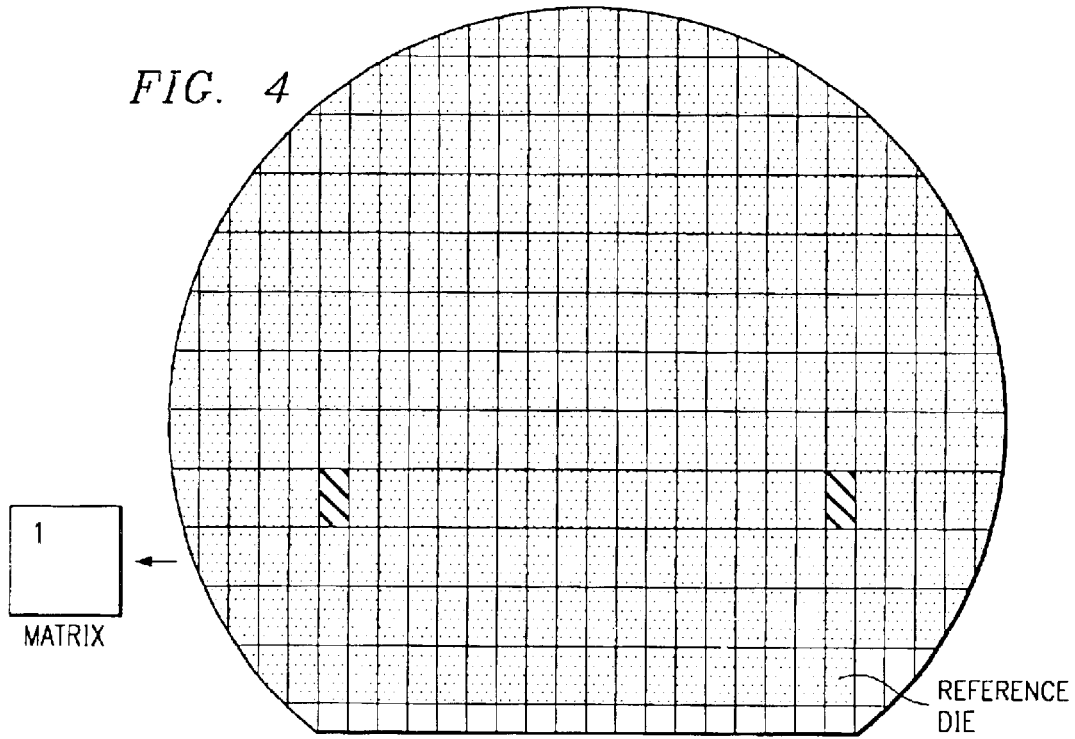
FIG. 4 illustrates the reference die position in neighborhood learning.
Figure 5:
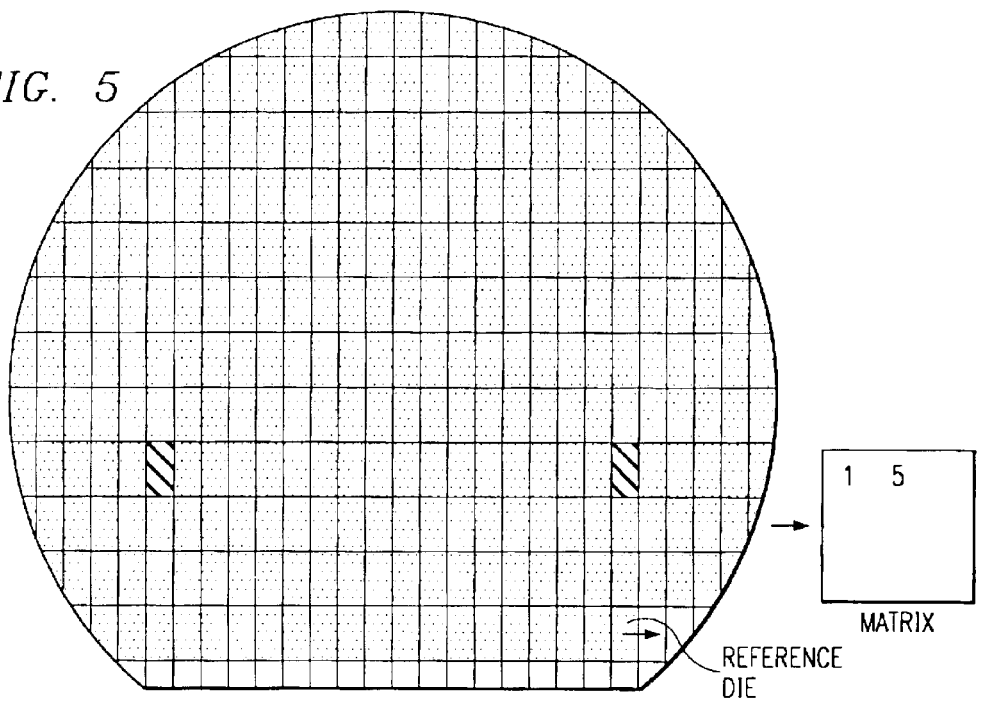
FIG. 5 illustrates the reference die and the first step in the wafer table movement for neighborhood learning.
Figure 6:
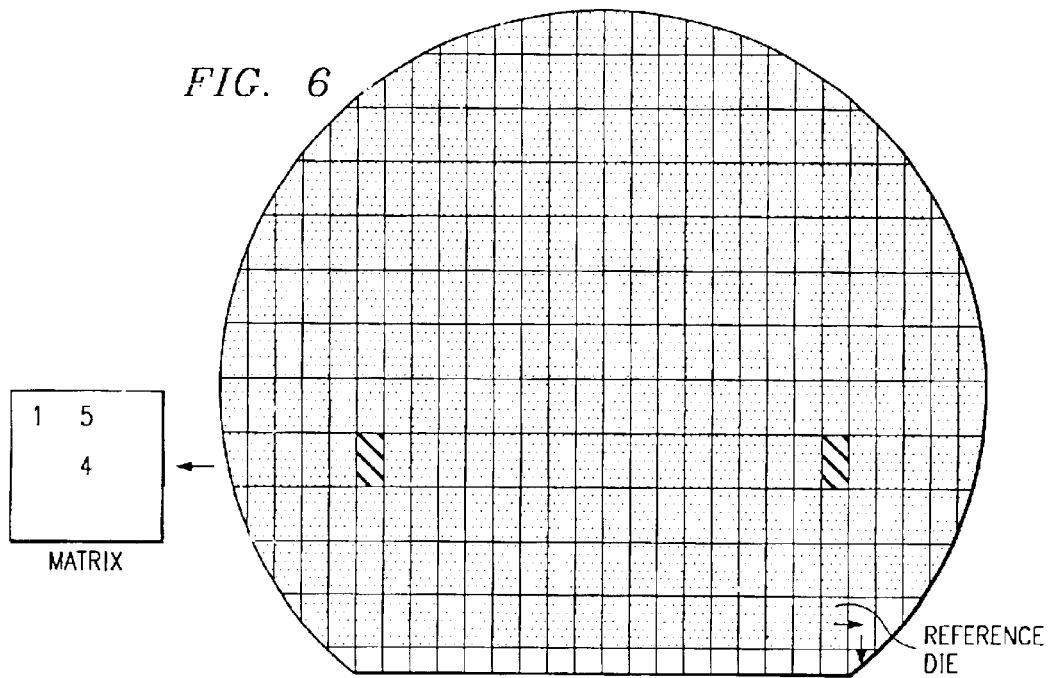
FIG. 6 illustrates the reference die and the second step in the wafer table movement for neighborhood learning.
Figure 9:
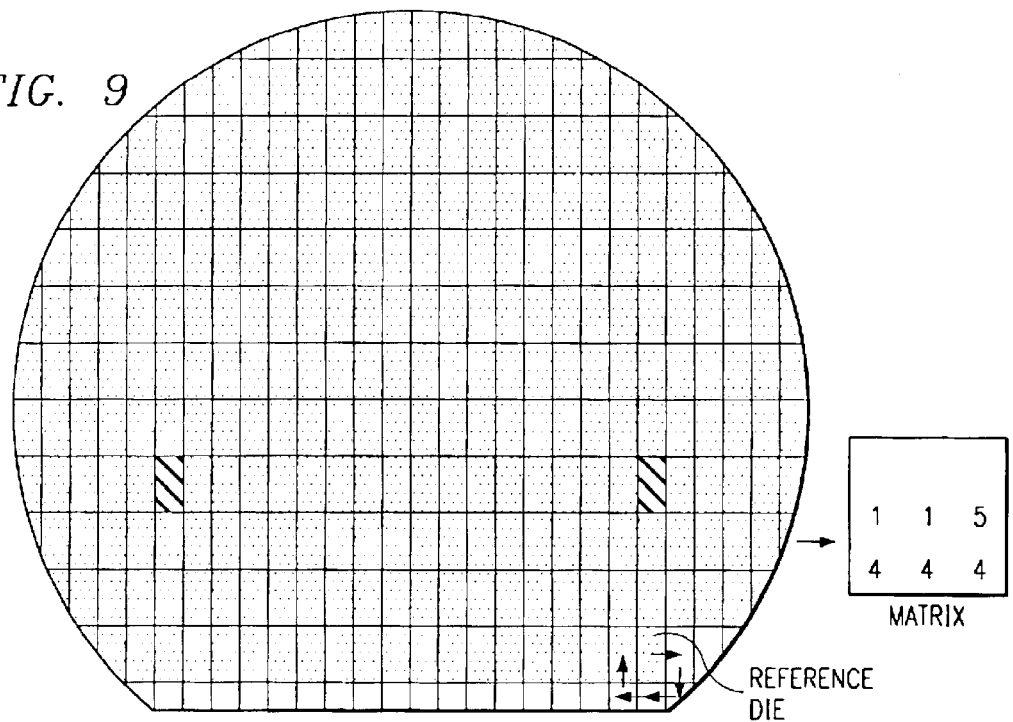
FIG. 9 illustrates the reference die and the fifth step in the wafer table movement for neighborhood learning.
Figure 10:
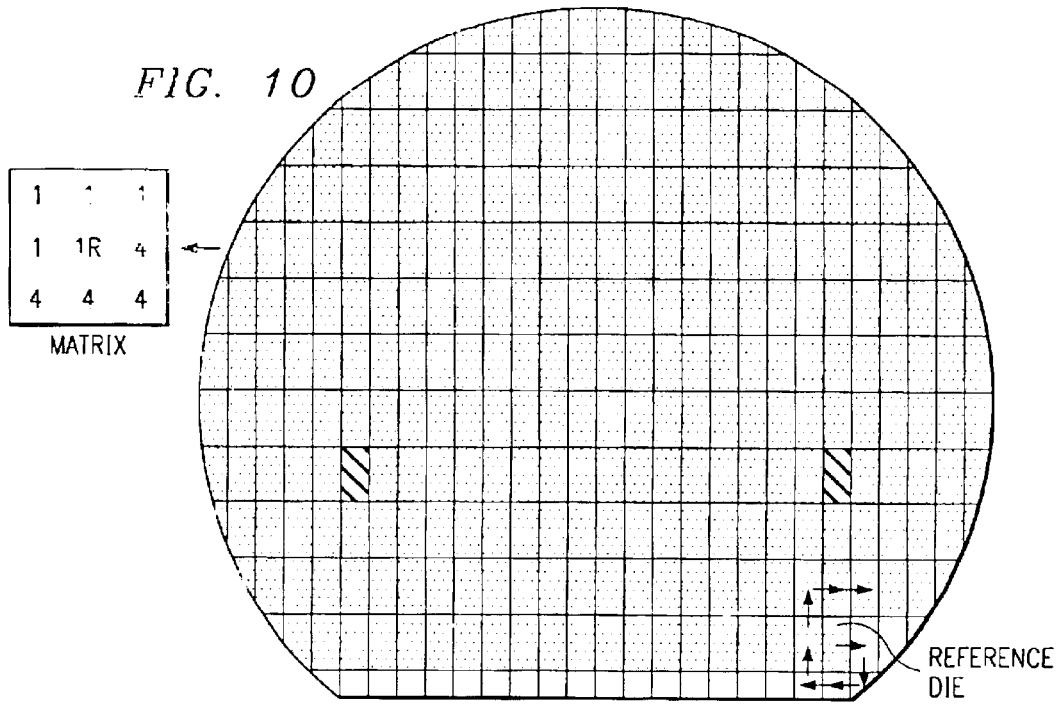
FIG. 10 illustrates the reference die and the eight steps in the wafer table movement for neighborhood learning.

It is required for the first time to teach the Reference die and its neighborhood. This learning would be for a particular device. Subsequent wafers of the same device would have the same pattern. The pick and place equipment may be a die bonder like that described in Balamurugan U.S. Pat. No. 5,851,848. This patent is incorporated herein by reference). This equipment would have a program that follows the flow charts herein to perform the operations. The flow chart of FIG. 3 illustrates the steps to neighborhood learning (Step I) discussed below.

Figure 1:
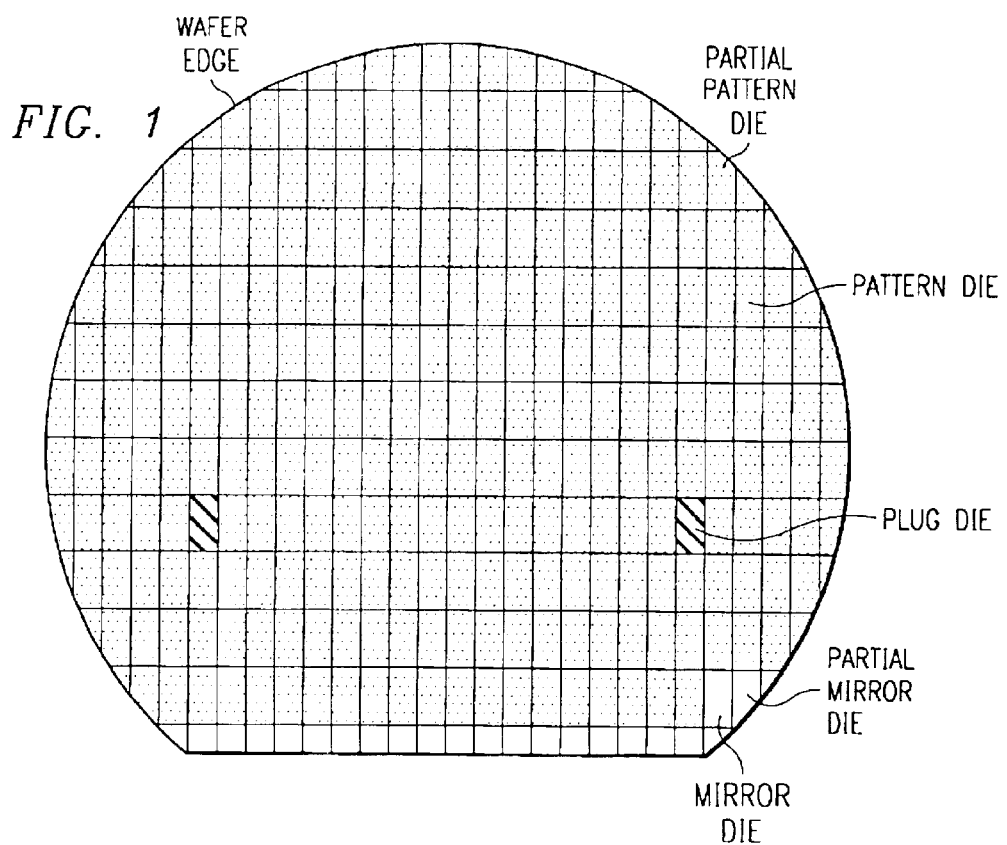
FIG. 1 illustrates a wafer with a pattern dies, partial pattern dies, mirror dies, partial mirror dies, plug dies and wafer edge.
Figure 2:
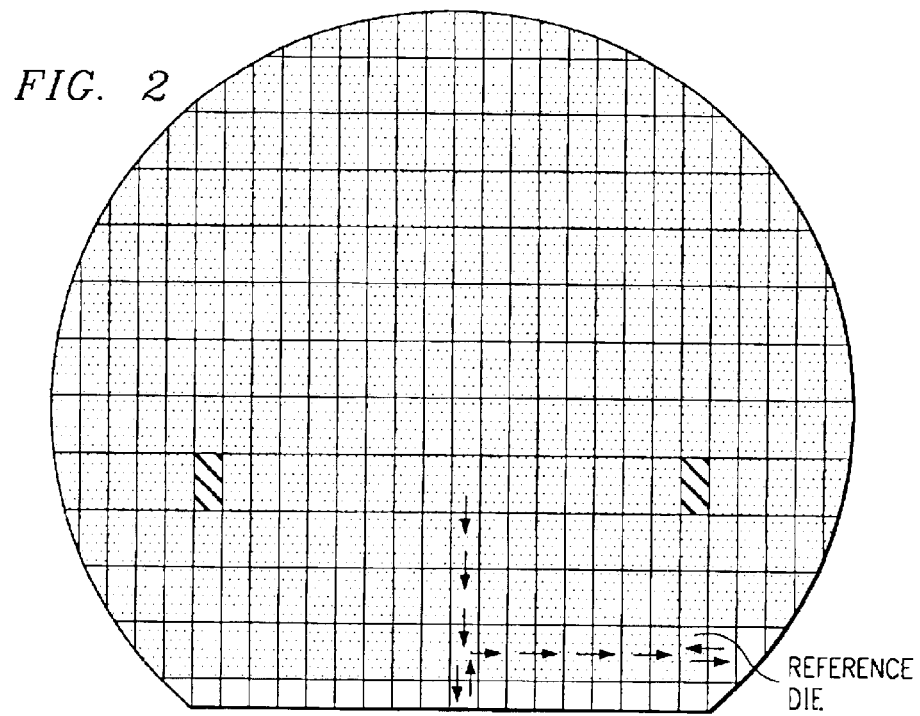
FIG. 2 illustrates a method of searching for a reference die according to the prior art.

Step 1. Load a wafer in the pick and place equipment.
Step 2. Move the wafer table manually to the reference die location and teach the position.
Step 3. Read and Store the wafer table Reference die X and Y coordinates.
Step 4. Perform neighborhood learning. For neighborhood learning the following information is used to form the neighborhood matrix. See FIG. 1
1—Good pattern die and align
2—Good pattern die and align failed
3—Partial pattern die
4—Partial mirror die
5—Mirror die
6—Plug die
7—No die
8—Ink die
9—Exceed wafer diameter
10—Exceed wafer table limit
11—Edge of wafer
12—Edge of wafer table Neighborhood learning is the process of making a neighborhood matrix by moving the wafer table clockwise one die at a time in a circle up to N_DIES_LEARN. See FIGS. 4 to 11. The wafer table movement up to N_DIES_LEARN (number of does to learn) is as follows:

Step A. From Reference die move wafer table one die to the right and gather information and update the neighborhood matrix. See FIG. 5. In the example a mirror die is detected. The reference die is a good die so it is a one and the die to the right is a reference die so a 5 is added to the right of a 1.

Step B. Move the wafer table one die down and gather information and update the neighborhood matrix. See FIG. 6. The die is a partial die so a 4 is recorded.

Step C. Move the wafer table one die left and gather information and update the neighborhood matrix. See FIG. 7. A second partial die or 4 is recorded.

Step D. Move the wafer table one die left and gather information and update the neighborhood matrix. See FIG. 8. A third partial die or 4 is recorded.

Step E. Move the wafer table one die up to a die to the left of the reference die and gather information and update the neighborhood matrix. It is a good die and so a 1 is recorded.

Step F. Move the wafer table one die up and gather information and update the neighborhood matrix. It is another good die so a 1 is recorded.

Step G. Move the wafer table one die to the right and gather information and update the matrix. Since it is another good die a one is recorded.

Step H. Move the wafer table one die to the right and gather information and update the matrix. Since this is another good die a one is recorded. The neighborhood is a matrix as follows after the neighborhood learning for 8 dies.
111
1R5
444

Where "R" is Reference die, and has the value 1 to 8.

Figure 11:
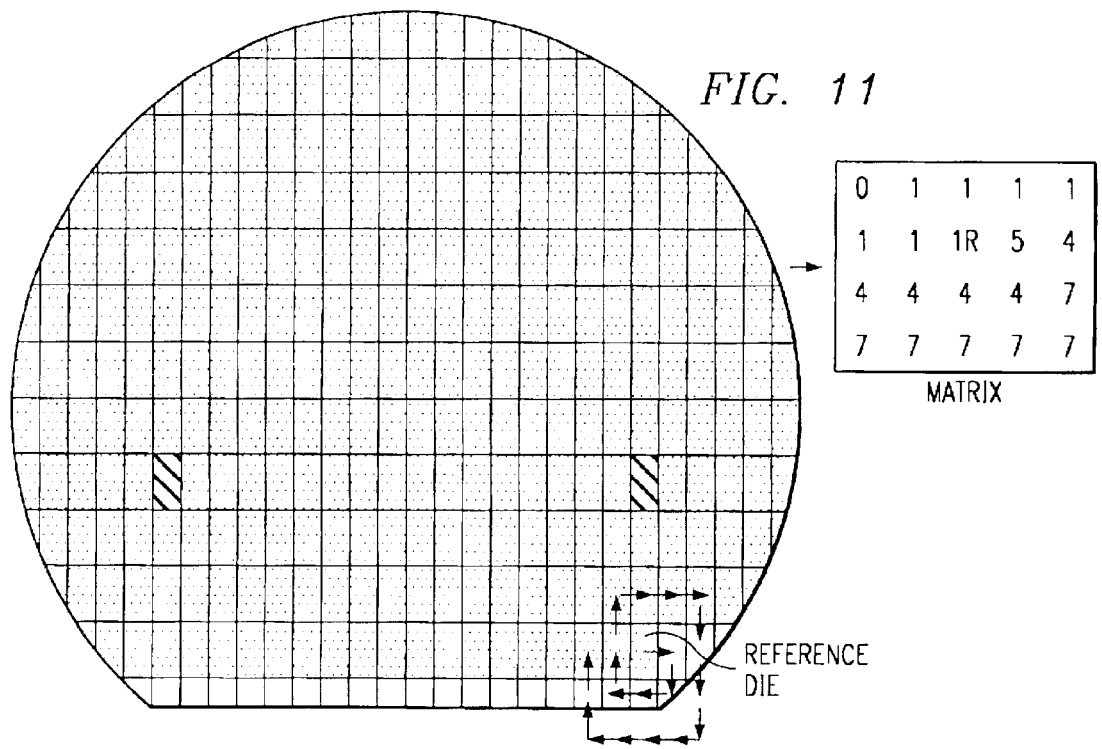
FIG. 11 illustrates the reference die and eighteen steps in the wafer table movement for neighborhood learning.

FIG. 11 illustrates die neighborhood learning for 18 dies. Again the starting position is the reference die R and the wafer table moves twice around the reference die recording 5,4,4,4,4,1,1,1,1,4,7,7,7,7,7,7,4,1,0. The recorded 7 refers to no die.

After the neighborhood learning, the neighborhood matrix is called "Taught Neighborhood Matrix."

Once the neighborhood matrix is recorded it is used in Step II for every wafer for the same type of device to search for the reference die. The neighborhood matrix may be provided for the device type, may be sent with the wafer to the pick and place equipment location or may be learned at the pick and place location and then used to search for the reference die.

Figure 12:
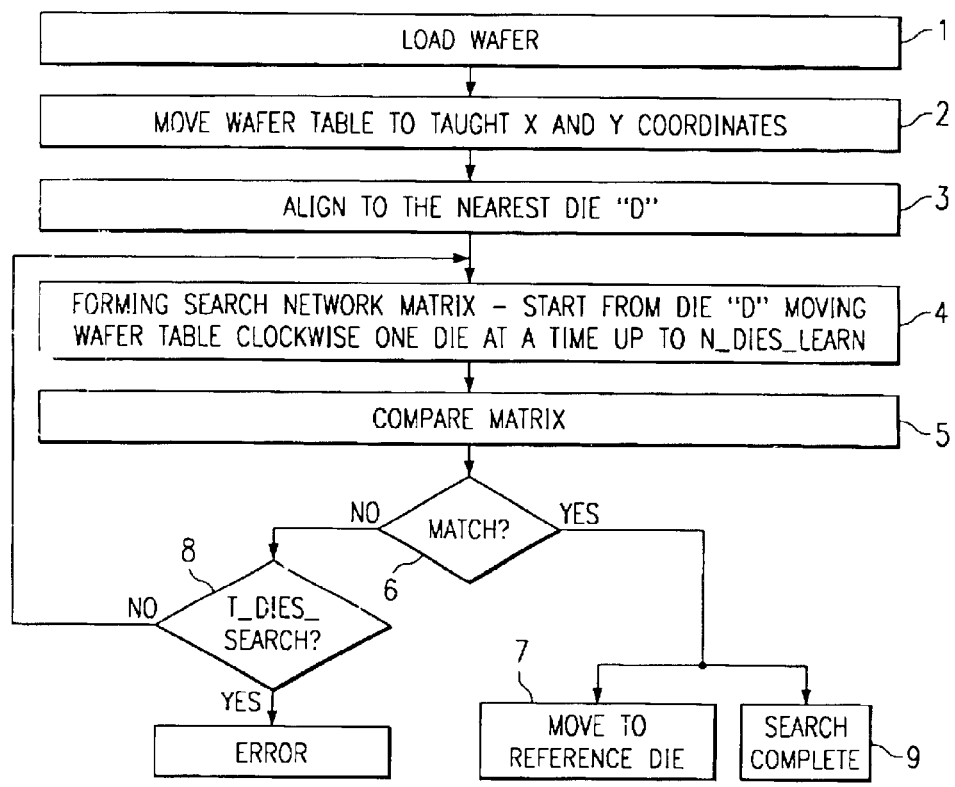
FIG. 12 is a flow chart of neighborhood matrix searching for the reference die according to one embodiment of the present invention.

According to the present invention and with reference to flow chart of FIG. 12 are the following steps for searching the reference die.

Step 1 Load wafer in the pick and place equipment.

Step 2 Move wafer table to Taught Reference die X and Y coordinate position.

Figure 13:
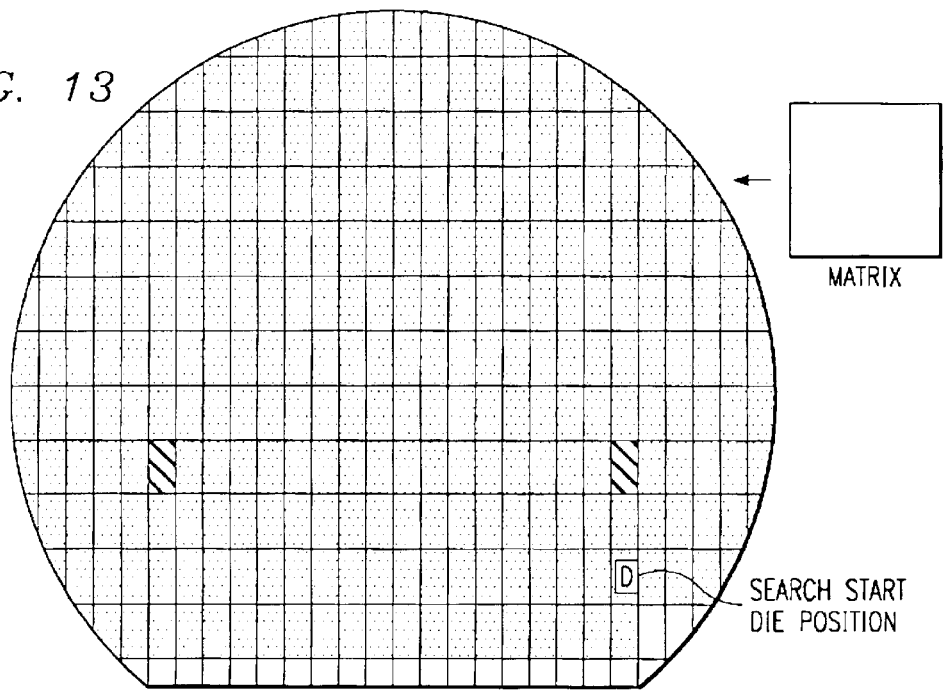
FIG. 13 illustrates the wafer table moving to Reference Die X and Y coordinates and aligning to the nearest die.

Step 3 Align to a nearest die "D". This may or may not be a reference die because the wafer placement on the wafer table may not be consistent with the map. See FIG. 13.

Figure 14:
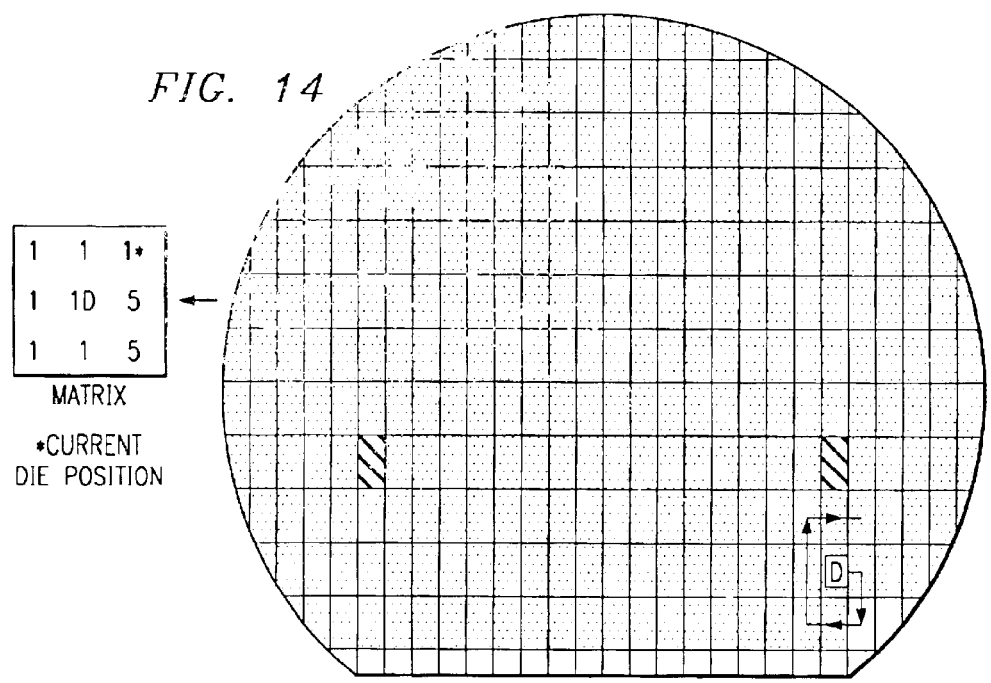
FIG. 14 illustrates forming search neighborhood matrix.

Step 4 Forming a neighborhood search matrix. This is started from the align die "D" position and a search neighborhood matrix is generated by moving the wafer table clockwise one die at a time in a circle up to the wafer N-DIES-LEARN (number of dies to learn). See FIG. 14.

Step 5. Search Neighborhood Matrix is compared to the Taught Neighborhood Matrix" generated in the learning Step I. If the two matrix are the same then the die "D" is the Reference die and go to the Step 9.

Step 6. If not a matrix match at Step 5 continue forming the neighborhood matrix and updating the search neighborhood matrix (Steps 4 and 5 until total number of dies to search (T_DIES_19 and 20 SEARCH) or find a Taught Neighborhood Matrix. Wafer table moves every die. For every die the system updates the Search Neighborhood Matrix and searches the Taught neighborhood matrix in the Search Neighborhood Matrix. See FIG. 15.

Figures 15, 16A, 16B, 16C, 16D:
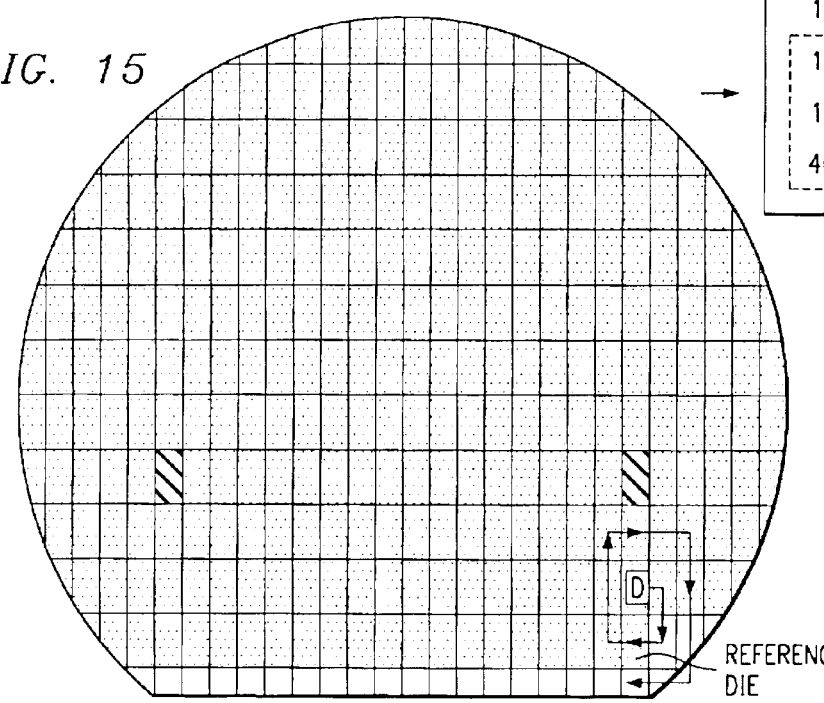
FIG. 15 illustrates search neighborhood matrix match Taught Neighborhood matrix after 16 dies.
FIG. 16a illustrates the taught neighborhood matrix.
FIG. 16b illustrates the search neighborhood matrix.
FIG. 16c illustrates taught neighborhood matrix match in the search neighborhood matrix and FIG. 16d illustrates the location of the reference die and the table movement to the reference die position.

Step 7. If the system finds Taught Neighborhood Matrix in Search Neighborhood Matrix then from the current die position it moves to Reference die position. It then goes to Step 9. FIG. 15 illustrates the process where the start position die is one row above the reference die to be found. FIG. 16a illustrates the taught with start reference die R, FIG. 16b illustrates the search matrix with search start position D, FIG. 16c illustrates by the dashed lines where the taught neighborhood matrix matches the search neighborhood matrix, and FIG. 16d illustrates that from the match it is clear where the reference die is located. The wafer table then moves from the current position to the Reference die position as indicated by the arrow in FIG. 16.

Step 8 If the system is unable to find Taught Neighborhood Matrix in Search matrix up to T_DIES_ DEARCH then exit as Reference die search error.

Step 9 Reference die search complete.

Figures 17, 18A, 18B, 18C, 18D:
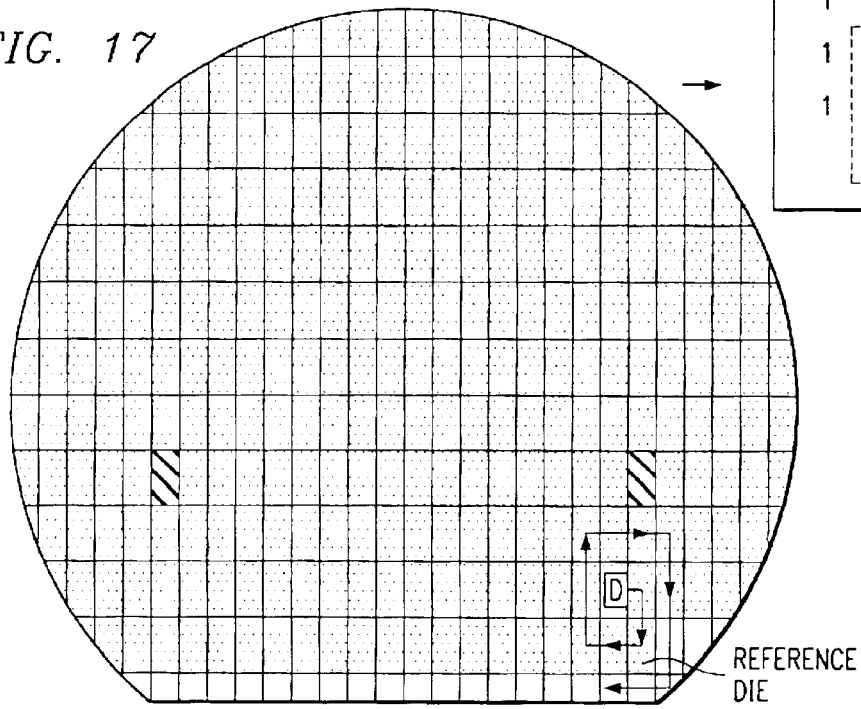
FIG. 17 illustrates the reference die search and illustrates the search neighborhood matrix match Taught Neighborhood matrix after 15 dies.
FIG. 18a illustrates the taught neighborhood matrix.
FIG. 18b illustrates the search neighborhood matrix.
FIG. 18c illustrates taught neighborhood matrix match in the search neighborhood matrix and FIG. 18d illustrates the location of the reference die and the table movement for the 15 dies in FIG. 17.

FIGS. 17 and 18 illustrate the search where the starting die D is to the upper left of the true reference die R. FIG. 18a illustrates the taught reference, FIG. 18b illustrates the search neighborhood matrix, FIG. 18c illustrates by dashed lines where the taught neighborhood matrix matches the search neighborhood matrix, and 18d illustrates by an arrow the movement of the wafer table to the Reference die position.

FIGS. 18 and 19 illustrate the search where the starting die D is the two dies to the left of the true reference die R and the match is found after 33 dies. FIG. 20a illustrates the taught reference, FIG. 20b illustrates the search neighborhood matrix, FIG. 20c illustrates by dashed lines where the taught neighborhood matrix matches the search neighborhood matrix, and 18d illustrates by an arrow the movement of the wafer table to the Reference die position.

Figure 21:
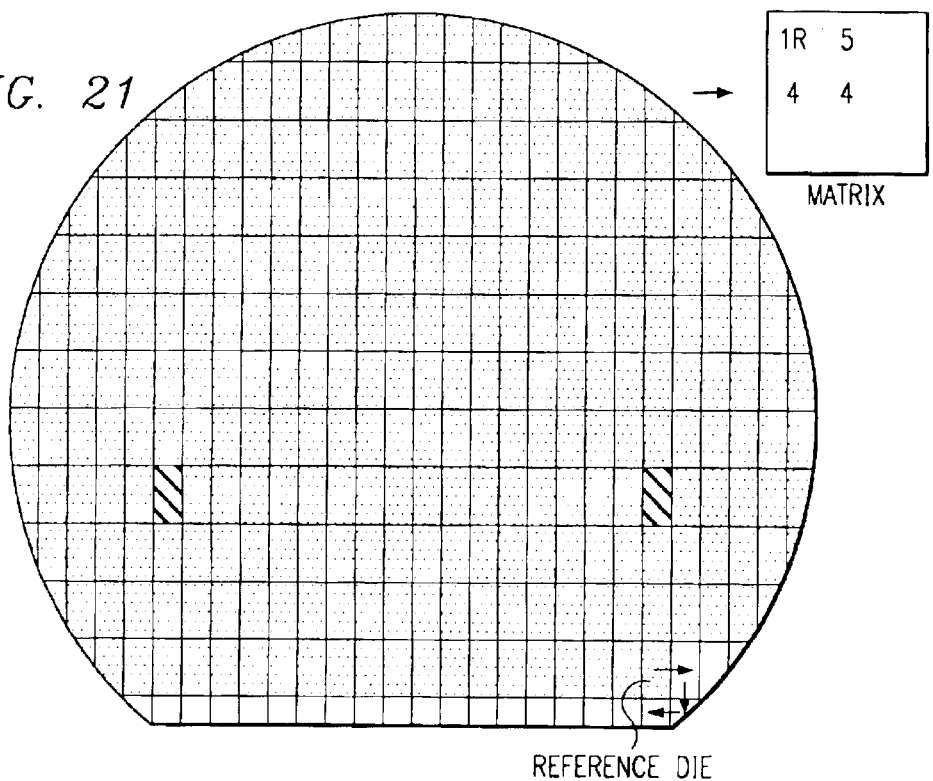
FIG. 21 illustrates reference die neighborhood learning for 3 dies and neighborhood matrix.
Figure 22:
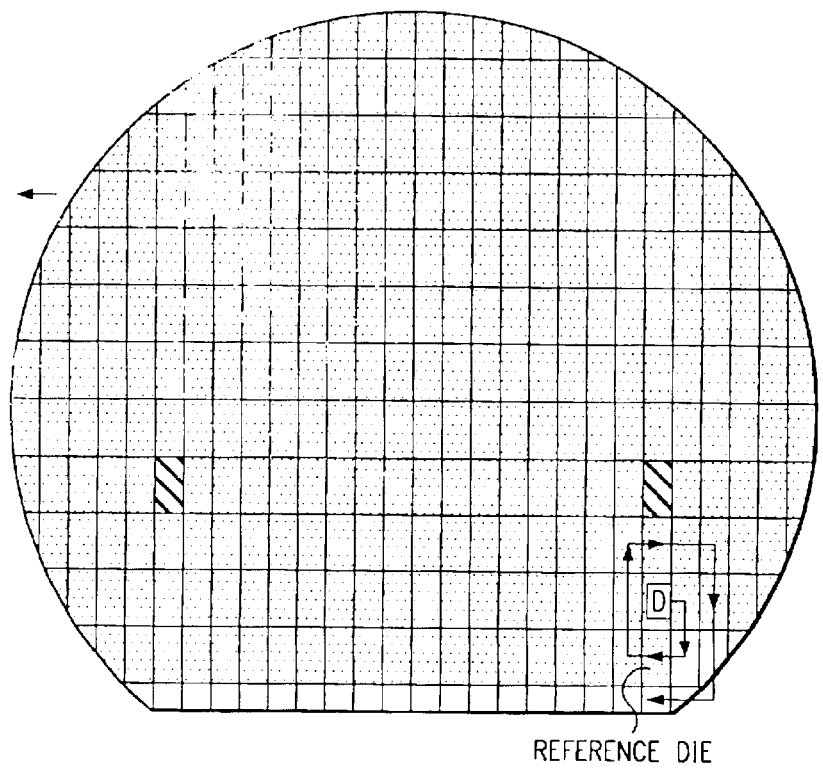
FIG. 22 illustrates reference die search and the search neighborhood matrix match Taught Neighborhood matrix after 16 dies for the learning of FIG. 21.

FIG. 21 illustrates reference die learning for 3 dies and FIGS. 22 and 23 illustrates the search matrix match after 16 dies.

Although embodiments have been described herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of searching for a reference die used for pick and place operation on a semiconductor wafer comprising the steps of:
   providing information about dies or partial dies neighboring said reference die used for pick and place operation; and
   searching and identifying said reference die by matching the neighboring dies or partial dies to said information about dies neighboring said reference die.

2. The method of claim 1 wherein said providing step information identifies the neighboring dies as full good dies, partial dies, mirror dies, and partial mirror dies and said searching and identifying step includes recording said information for the wafer loaded on the wafer table and comparing said providing information with the recorded information.

3. The method of claim 2 wherein said providing step includes recording the neighborhood dies by moving a wafer one die at a time about the reference die.

4. A method of identifying a reference die used for pick and place operation on a semiconductor wafer comprising the steps of:
   first recording information about dies neighboring said reference die used for pick and place operation; and
   later searching and identifying said reference die by placing a wafer on a wafer table and aligning the table at a taught reference die location and moving the wafer table one die at a time at the neighboring die locations about the taught reference die location and identifying neighboring dies at said neighboring die locations and comparing said recorded information about dies neighboring said reference die to identified neighboring dies to identify the reference die.

5. The method of claim 4 wherein said first recording information identifies the neighboring dies as fill good dies, partial dies, mirror dies, and partial mirror dies about said reference die and said later searching and identifying step includes recording information identifying full good dies, partial dies, mirror dies, and partial mirror dies information about the neighboring dies for the wafer loaded on the wafer table in a second recording and comparing said first recording information with said second recording.

6. The method of claim 5 wherein said first recording information step includes forming a first neighborhood matrix one die at a time and said searching and identifying step includes a forming a search neighborhood matrix and said comparing includes matching said first neighborhood matrix with said search neighborhood matrix.

7. The method of claim 6 including the step of when a match is found moving the wafer table to the matched reference die.

8. The method of claim 1 including the step of when a match is found moving the wafer table to the matched reference die.

9. The method of claim 4 including the step of when a match is found moving the wafer table to the matched reference die.

10. The method of claim 4 wherein said first recording information step is performed by starting at a taught reference die location and moving clockwise about the taught reference die location one die at a time identifying and recording the neighboring die as full good die, partial die, mirror die, or partial mirror die and said later searching and identifying step includes aligning the wafer table at the taught reference die location coordinates determined by the recording step and starting at this taught reference die location moving the wafer table clockwise one die at a time to the neighboring dies about the taught reference die locations identifying and recording later searched die information as full good die, partial die, mirror die, or partial mirror die and comparing to said first recorded information about dies neighboring said taught reference die and to said later searched die information to identify the reference die.

11. The method of claim 10 including the step of when a match is found moving the wafer table to the matched reference die.

* * * * *